United States Patent
Ertosun

(10) Patent No.: US 9,053,789 B1
(45) Date of Patent: Jun. 9, 2015

(54) TRIGGERED CELL ANNIHILATION FOR RESISTIVE SWITCHING MEMORY DEVICES

(71) Applicant: Adesto Technologies Corporation, Sunnyvale, CA (US)

(72) Inventor: Mehmet Gunhan Ertosun, San Francisco, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 252 days.

(21) Appl. No.: 13/859,853

(22) Filed: Apr. 10, 2013

Related U.S. Application Data

(60) Provisional application No. 61/636,800, filed on Apr. 23, 2012.

(51) Int. Cl.
  *G11C 11/00* (2006.01)
  *G11C 13/00* (2006.01)

(52) U.S. Cl.
  CPC .................................. *G11C 13/0069* (2013.01)

(58) Field of Classification Search
  CPC .................................................. G11C 13/0004
  USPC .................. 365/148, 163, 171, 173, 158, 200
  See application file for complete search history.

(56) References Cited

U.S. PATENT DOCUMENTS

| | | | |
|---|---|---|---|
| 2006/0044899 | A1 | 3/2006 | Ellis et al. |
| 2010/0271860 | A1* | 10/2010 | Muraoka et al. ............. 365/148 |
| 2011/0069528 | A1 | 3/2011 | Gammel et al. |
| 2013/0250654 | A1* | 9/2013 | Sugimae et al. ............. 365/148 |
| 2014/0321197 | A1* | 10/2014 | Ninomiya et al. ............ 365/148 |

* cited by examiner

*Primary Examiner* — Han Yang
(74) *Attorney, Agent, or Firm* — Michael C. Stephens, Jr.

(57) ABSTRACT

Structures and methods of operating a resistive switching memory device are disclosed herein. In one embodiment, a resistive switching memory device, can include resistive memory cells configured to be programmed to a low resistance state by application of a first voltage, and to be erased to a high resistance state by application of a second voltage; a detector configured to detect when at least one resistive switching memory cell is to be rendered inoperable; and a program/erase controller configured to render the at least one resistive switching memory cell inoperable by application of a third voltage during a program/erase operation, where the third voltage is greater in absolute value than the first or second voltage, and where the at least one resistive switching memory cell rendered inoperable remains in the low/high resistance state after subsequent erase/program operations.

20 Claims, 10 Drawing Sheets

TRIGGERED CELL ANNIHILATION FOR RESISTIVE SWITCHING MEMORY DEVICES

RELATED APPLICATIONS

This application claims the benefit of U.S. Provisional Application No. 61/636,800, filed Apr. 23, 2012, which is incorporated herein by reference in its entirety.

FIELD OF THE INVENTION

The present invention generally relates to the field of semiconductor memory. More specifically, embodiments of the present invention pertain to resistive random-access memory (ReRAM) and/or conductive bridging RAM (CBRAM) processes and devices.

BACKGROUND

Non-volatile memory (NVM) is increasingly found in applications, such as solid-state hard drives, removable digital picture cards, and so on. Flash memory is the predominant NVM technology in use today. However, flash memory has limitations, such as a relatively high power, as well as relatively slow operation speed. Other NVM technologies, such as resistive switching memory technologies including resistive RAM (ReRAM) and conductive bridging RAM (CBRAM), may offer relatively lower power and higher speeds as compared to flash memory technologies. For example, CBRAM utilizes a conductive bridging cell technology, which has the potential to scale to smaller sizes than flash memory devices.

SUMMARY

Embodiments of the present invention relate to a resistive switching memory device with program/erase operations that can be used to render the device inoperable.

In one embodiment, a resistive switching memory device can include: (i) a plurality of resistive memory cells, where each of the resistive switching memory cells is configured to be programmed to a low resistance state by application of a first voltage, and to be erased to a high resistance state by application of a second voltage; (ii) a detector configured to detect when at least one of the plurality of resistive switching memory cells is to be rendered inoperable; (iii) a program controller configured to render the at least one resistive switching memory cell inoperable by application of a third voltage during a program operation, where the third voltage is greater in absolute value than the first voltage, and where the at least one resistive switching memory cell rendered inoperable remains in the low resistance state after subsequent erase operations; and (iv) an erase controller configured to render the at least one resistive switching memory cell inoperable by application of a fourth voltage during an erase operation, where the fourth voltage is greater in absolute value than the second voltage, and where the at least one resistive switching memory cell rendered inoperable remains in the high resistance state after subsequent program operations.

In another embodiment, a method of rendering a resistive switching memory device inoperable can include: (i) accessing security data related to the resistive switching memory device; (ii) determining whether the security data indicates that the resistive switching memory device is to remain operable; (iii) performing at least one of programming, erasing, and reading the resistive switching memory device when the security data is determined to indicate that the resistive switching memory device is to remain operable, where the programming includes changing a resistance of a resistive switching memory cell to a low resistance state by applying a first voltage, and where the erasing comprises changing the resistance of the resistive switching memory cell to a high resistance state by applying a second voltage; and (iv) disabling the resistive switching memory device when the security data is determined to indicate that the resistive switching memory device is to be rendered inoperable by applying a third voltage, where the third voltage is greater in absolute value than either of the first and second voltages.

In yet another embodiment, a programmable impedance element can include: (i) an electrochemically active electrode; (ii) a solid electrolyte coupled to the active electrode; (iii) an inert electrode coupled to the solid electrolyte on an opposite side than the active electrode; (iv) where the programmable impedance element is configured to be programmed by formation of a conductive path between the active and inert electrodes by application of a first voltage across the active and inert electrodes; (v) where the programmable impedance element is configured to be erased by dissolving the conductive path by application of a second voltage across the active and inert electrodes; and (vi) where the programmable impedance element is configured to be rendered inoperable by application of a third voltage across the active and inert electrodes, the third voltage being greater in absolute value than either of the first and second voltages.

Embodiments of the present invention can advantageously provide for data security by allowing for intentional disabling of memory cells. Particular embodiments are suitable for resistive switching memories, such as resistive random-access memory (ReRAM) and/or conductive bridging RAM (CBRAM) memory cells. These and other advantages of the present invention will become readily apparent from the detailed description of preferred embodiments below.

DETAILED DESCRIPTION OF EMBODIMENTS

Figure 1:
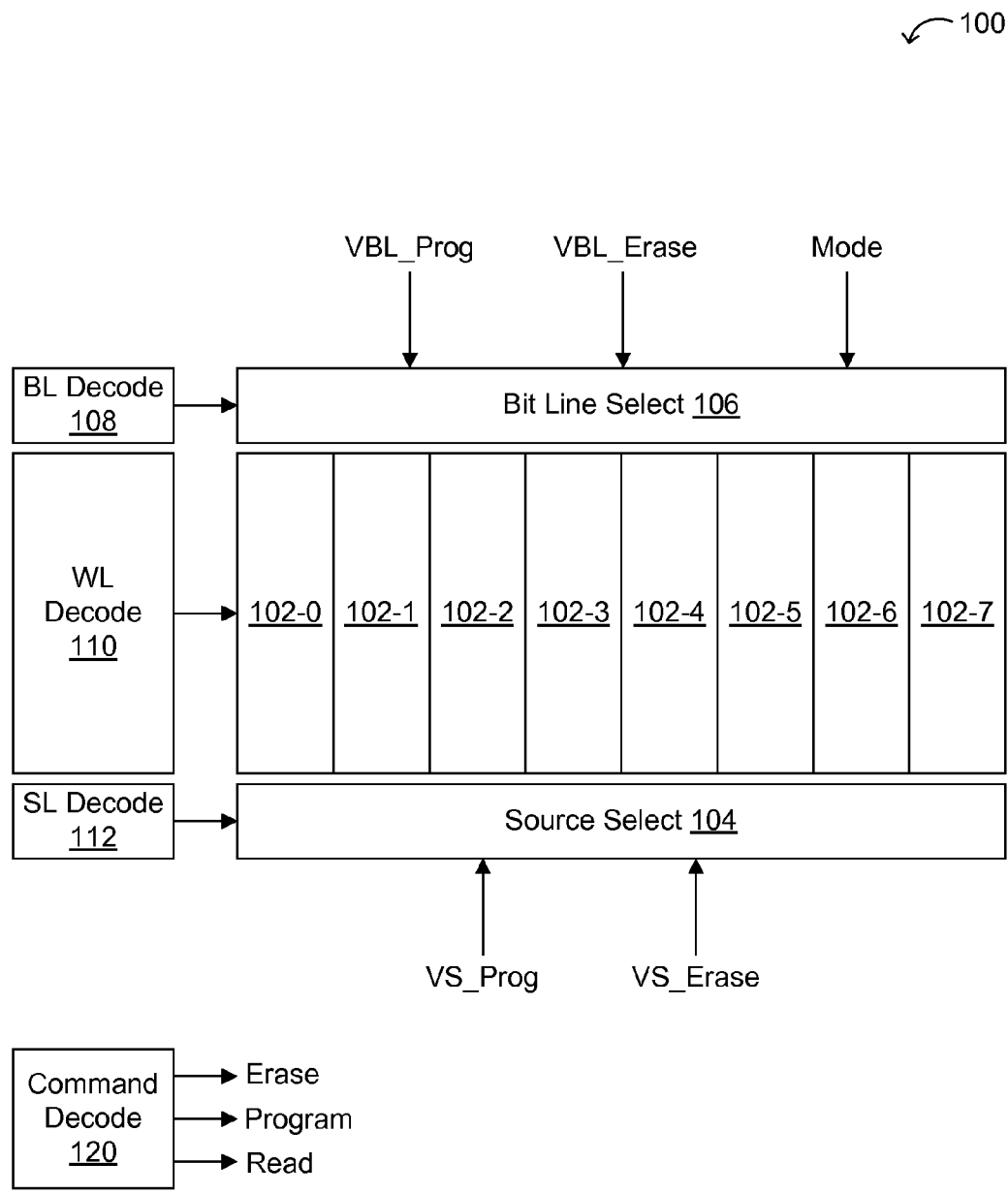
FIG. 1 is an example memory device arrangement.

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Particular embodiments may be directed to resistive switching memories, such as programmable metallization cells (PMC). Examples of such cells are shown and described in U.S. Pat. Nos. 6,635,914 and 7,359,236. The invention, in its various aspects, will be explained in greater detail below with regard to exemplary embodiments. The embodiments show structures and methods of operating resistive switching memories (e.g., programmable metallization cells [PMCs]) that can be programmed/written and erased between one or more resistance and/or capacitive states.

Figure 2:
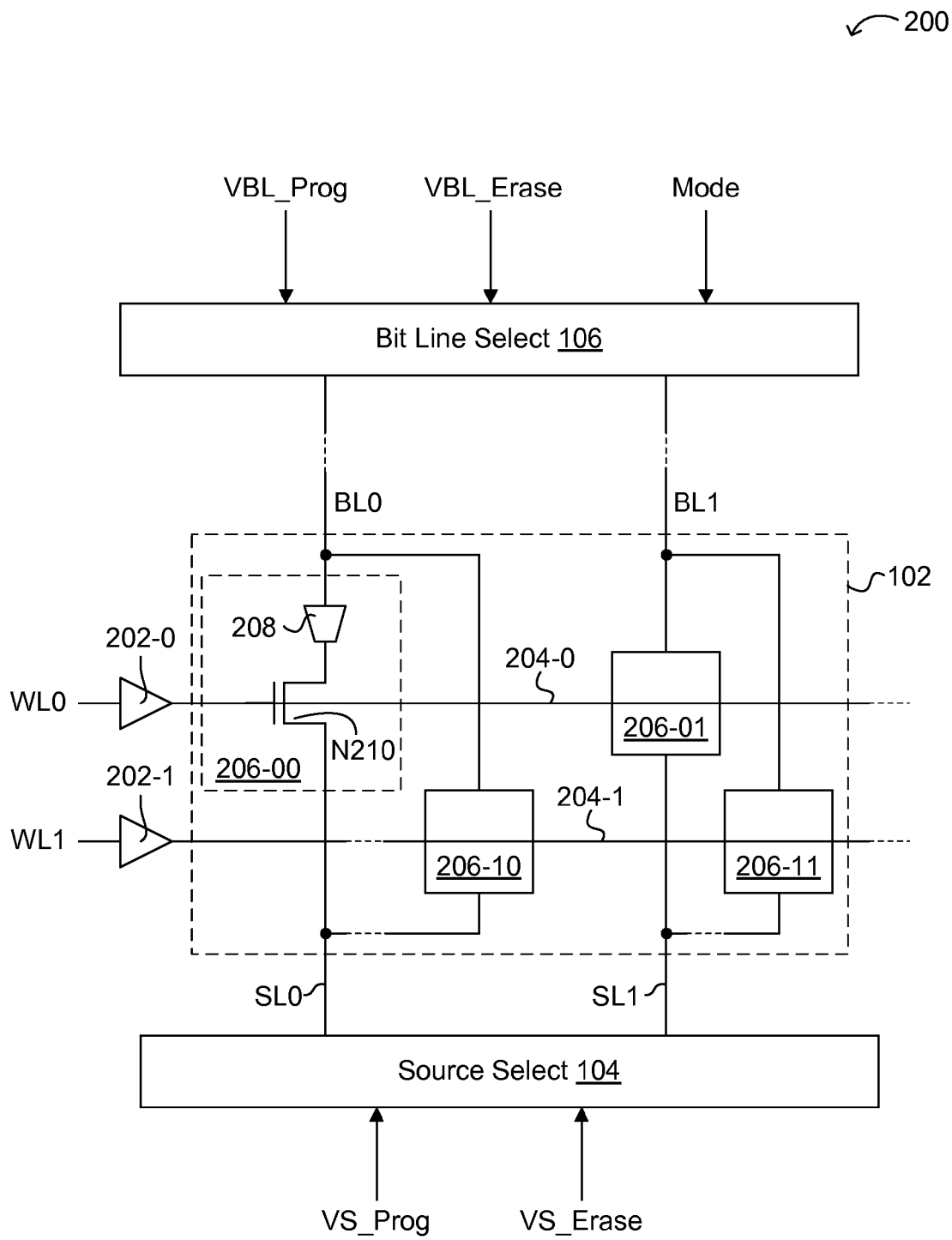
FIG. 2 is a schematic block diagram of an example memory device and memory cell structure.

FIGS. 1 and 2 show example memory architectures and circuit structures that can utilize PMCs of particular embodiments. However, PMCs of particular embodiments are suitable for use in a wide variety of memory architectures and circuit structures.

Referring now to FIG. 1, an example memory device is shown and designated by the general reference character 100. A memory device 100 can include PMC sectors 102-0 to 102-7, source node selection circuitry 104, bit line selection circuitry 106, bit line decoding circuitry 108, word line decoding circuitry 110, and source line decoding circuitry 112. A memory device 100 can be a single integrated circuit or form a portion of a larger integrated circuit device that provides functions in addition to memory, such as in an "embedded" memory configuration.

FIG. 1 may also include command decoding circuitry 120. For example, command decoding circuitry 120 may receive external signals, or control signals derived therefrom, and may generate various internal control signals (e.g., program, erase, read, etc.) in response. Such internal operation control signals can be used to generate various supply levels (e.g., particular program and erase voltage levels), as well as other control signals (e.g., erase operation control signals), as will be discussed in more detail below. In this way, command decoding circuitry 120 may be used to determine an operation to be performed on the device.

PMC sectors (102-0 to 102-7) can each include a number of memory cells arranged into one or more columns and multiple rows. Each memory cell can include one or more PMCs and a selection device. Generally, a PMC may be configured such that when a bias greater than a threshold voltage ($Vt_{PMC}$) is applied across electrodes of the PMC, the electrical properties of the PMC can change. For example, in some arrangements, as a voltage is applied across the electrodes of the PMC, conductive ions within an ion conductor may begin to migrate and form an electrodeposit at or near the more negative of the electrodes. Such an electrodeposit, however, is not required to induce a change in electrical properties. The term "electrodeposit" as used herein means any area within the ion conductor that has an increased concentration of reduced metal or other conductive material compared to the concentration of such material in the bulk ion conductor material. As the electrodeposit forms, the resistance between the electrodes can decrease, and other electrical properties may also change. If a voltage is applied in reverse, the electrodeposit can dissolve back into the ion conductor and a device can return to a former electrical state (e.g., high resistance state).

In particular arrangements, one electrode of a PMC can be formed of a material including a metal that dissolves in the ion conductor when a sufficient bias is applied across the electrodes (oxidizable electrode), and the other electrode is relatively inert and does not dissolve during operation of the programmable device (an indifferent or "inert" electrode). For example, one electrode may be an anode during a write process and be comprised of a material including silver that dissolves in an ion conductor while another electrode may be a cathode during the write process and be comprised of an inert material, such as tungsten, nickel, molybdenum, platinum, metal silicides, and the like. Having at least one electrode formed of a material including a metal which dissolves in an ion conductor can facilitate maintaining a desired dissolved metal concentration within an ion conductor, which in turn, can facilitate rapid and stable electrodeposit formation within ion conductor or other electrical property change during use of a PMC. Furthermore, use of an inert material for the other electrode (cathode during a write operation) can facilitate electrodissolution of any electrodeposit that may have formed and/or return of the programmable device to an erased state after application of a sufficient voltage.

Referring still to FIG. 1, in the particular example shown, PMC sectors (102-0 to 102-7) can have a "bit line anode" configuration. That is, for each given memory cell, the anode of the corresponding PMC(s) can be connected to a bit line by a conductive connection that does not include the corresponding access device. Each such bit line may provide a read data path for the corresponding PMC. This represents just one example PMC architecture, and is in contrast to other PMC memory device architectures that have bit lines connected to a corresponding PMC via the access device of the cell. As noted above, PMCs in particular embodiments are suitable for use in any type of PMC memory device architecture.

PMC sectors (102-0 to 102-7) may also have a "strapped source line" architecture. Within each PMC sector, groups of access devices within each memory cell can have terminals formed by diffusions in an integrated circuit substrate. Groups of such diffusions can be "strapped" by a low resistance structure that provides a conductive connection between groups of such diffusion regions. Such an arrangement can be in contrast to a PMC architecture in which access devices may be directly connected to a bit line. Also, while eight PMC sectors (102-0 to 102-7) are shown in the particular example of FIG. 1, other examples may include fewer or greater numbers of PMC sectors. In FIG. 1, source node selection circuitry 104 can selectively connect source straps to various nodes depending upon the mode of operation and a source decoding value. In one particular example, source node selection circuitry 104 can connect a selected source strap between at least two different voltages, depending on whether the device is operating in a program operation or read operation, or in an erase operation.

Voltages VBL_Prog, VBL_Erase, VS_Prog, and VS_Erase may be conventional power supply voltages, such +5 and 0 volts, or +3.3 and 0 volts, or +1.2 and 0 volts. In one example, such voltages may be one or more power supply voltages received at an external pin of an integrated circuit including memory device 100. In another example, such voltages may be one or more voltages generated by a voltage regulator of an integrated circuit that includes memory device 100. In any event, such voltages may be used, either directly or indirectly, for programming (e.g., in a forward bias configuration) or erasing (e.g., in a reverse bias configuration) a PMC by applying suitable voltages across the electrodes thereof.

Bit line selection circuitry 106 can selectively connect bit lines of one or more PMC sections (102-0 to 102-7) according to a mode of operation and bit line decoding values. In one particular example, bit line selection circuitry 106 can advantageously connect a selected bit to either of voltages VBL_Prog or VBL_Erase. That is, in a program operation, a selected bit line can be connected to voltage VBL_Prog, while in an erase operation, a selected bit line can be connected to voltage VBL_Erase.

Bit line selection circuitry 106, similar to source selection circuitry 104, can connect bit lines to an inhibit voltage for PMCs that are not selected for erase or program. It is noted that an arrangement like that shown in FIG. 1 can advantageously provide program and erase voltages without having to include charge pumps or the like, to a voltage that is outside a power supply range, as may exist in other approaches. Instead, supply voltages applied across a selected PMC device can be switched between program and erase operations. In this way, program and erase can be "symmetric" operations. That is, in a programming operation, a PMC to be programmed can be connected between suitable voltages (e.g., V1–V2) in an anode-to-cathode direction. In an erase operation, a PMC to be erased can be connected between suitable voltages (e.g., V2–V1) in an cathode-to-anode direction.

In this example, voltages V1 and V2 (not shown in FIG. 1) may be applied as one or more of voltages VBL_Prog, VBL_Erase, VS_Prog, and VS_Erase. This is in contrast to architectures that maintain a constant voltage on anodes of PMCs, and then provide program and erase voltages with respect to such a common anode voltage. In such a case, a supply voltage must be equal to a program voltage plus an erase voltage (Vprog+Verase). However, in a symmetric operation according to an embodiment, a program voltage may be equal to an erase voltage, which may both be within the range of a supply voltage (Vprog=V1−V2, Verase=V2−V1, Supply voltage=maximum of V1 and V2). In any event, a suitable voltage may be applied across a PMC in order to program the cell, and a reverse such voltage may be applied across the PMC in order to erase the cell.

Bit line decoding circuitry 108 can generate values for selecting given bit lines for read, program, and erase operations. In one arrangement, in response to address information (e.g., column address data), bit line decoding circuitry 108 can generate bit line select signals for application to bit line select circuitry 106.

Word line decoding circuitry 110 can generate values for selecting a given set of memory cells by enabling access devices in one or more selected rows of PMC sections (102-0 to 102-7). In response to address information (e.g., row address data), one or more word lines can be driven to a select voltage to thereby enable the corresponding select device (e.g., a transistor) in a row of memory cells. In this way, the PMCs of the selected row can be connected to a source node. Word lines can extend in a direction different than (e.g., essentially perpendicular to) the source straps.

Source decoding circuitry 112 can generate values for selecting given source straps. In one arrangement, in response to address information (e.g., column address data), source decoding circuitry 112 can generate source select signals for application to source node select circuitry 104. Source decoding circuitry 112 can select a source strap corresponding to a same memory cell as a selected bit line, and thereby enable a program, read, or erase operation.

In this way, a memory device can include PMCs as data storage elements with anodes commonly connected to bit lines and memory cell access devices connected to strapped and decoded sources. Such select circuitry can also provide for symmetrical program and erase operations utilizing bit line decoding and source strap decoding.

Referring now to FIG. 2, shown is a schematic block diagram of an example memory device and memory cell structure, as designated by the general reference character 200. Memory device 200 can be one implementation of the example shown in FIG. 1. Memory device 200 includes a PMC sector 102 that is shown for illustration purposes by four memory cells (e.g., 206-00, 206-10, 206-01, and 206-11), arranged into four columns and two rows (e.g., corresponding to WL0 and WL1). Two memory cells are shown connected to each of two bit lines BL0 and BL1. It is understood that the arrangement can be repeated to form a much larger memory cell array structure. Each memory cell (e.g., 206-00 to 206-11) can include a PMC 208 and an access device N210, which in this example is an n-channel insulated gate field effect (hereinafter "MOS") transistor. It is noted that while FIG. 2 shows an arrangement in which one PMC is provided per memory cell, alternate embodiments may include more than one PMC per memory cell.

PMCs 208 may have a structure as described in conjunction with FIG. 1, or equivalents. In the particular example of FIG. 2, PMC sector 102 also includes word line drivers 202-0 and 202-1. Word line drivers 202-0 and 202-1 can drive corresponding word lines 204-0 and 204-1 high to thereby select a memory cell, thus placing its corresponding select device (e.g., N210) into a low impedance state.

Read/write control circuitry within bit line selection circuitry 106 can vary in operation according to mode values. In a program operation, a read/write circuit can connect a selected bit line to an anode program voltage. In an erase operation, a read/write circuit can connect a selected bit line to an anode erase voltage. In a read operation, a read/write circuit can connect a selected bit line to a read bias voltage. Source line selection circuitry 104 can connect one or more of corresponding source straps (e.g., SL0 and SL1) to a source program voltage (VS_Prog), a source erase voltage (VS_Erase), or to a source de-select state. The source de-select state can be a high impedance state in the case of an "isolated" bit line architecture, or alternatively, can be a de-select bias voltage, in the case of a de-select bias architecture. Source line selection circuitry 104 can vary the number of source straps commonly driven to a same state. That is, source line selection circuitry 104 can select source straps connected to but one column of memory cells, or connected to multiple such columns.

Having described the various sections of FIG. 2, one example of the operation of such a memory device will now be described with reference to an operation that accesses memory cell 206-00. Initially, word lines 204 can be driven to a de-select voltage (e.g., low) by word line drivers 202. Bit line selection circuitry 106 can place bit lines BL0 and BL1 in the de-selected state. Similarly, source line selection circuitry 104 can place source straps SL0 and SL1 in the de-select state.

In a program operation, in response to address and mode data, bit line selection signals can be used to connect bit line BL0 to read/write control circuitry. In contrast, bit line BL1 can be de-selected, and thus placed in the de-selected state. Mode selection values can result in read/write control circuitry connecting the selected bit line (e.g., BL0) to an anode program voltage. A program operation can also include source selection signals connecting source strap SL0 to a source program voltage (e.g., VS_Prog), while connecting source strap SL1 to a source de-select state. A word line driver (e.g., 202-0) corresponding to the selected memory cell can be driven to a select voltage, thereby placing the selected PMC (e.g., PMC 208 of memory cell 206-00) between suitable programming voltages.

An erase operation can occur in the same general fashion, but with the erase voltage being applied to the selected bit line and source erase voltage (e.g., VS_Erase) being applied to a selected source strap. As noted in the example of FIG. 1, in particular embodiments, such an operation can be symmetrical, such that the anode programming voltage equals VS_Erase, and the anode erase voltage equals VS_Prog. Also, while FIG. 2 shows n-channel MOS transistors as access devices, other embodiments may include different types of access devices. In such alternate embodiments, word line drivers 202 would provide appropriate voltage and/or currents to enable such access devices. In this way, bit line selection, source selection, and word line activation can be utilized to program and/or erase a PMC array having bit lines connected to anodes of PMCs within multiple memory cells.

In particular embodiments, the erase operation can include a "strong" erase operation that substantially dissolves a conductive path and maximizes a cell resistance, followed by a "soft" program operation that creates a partial or a weaker conductive path. In this way, a more controlled erase operation and cell off resistance variation for a programmable impedance element can be provided.

While particular example architectures and circuits suitable for PMCs, and memory arrays formed thereof, with respect to FIGS. 1 and 2, programmable impedance elements in certain embodiments are suitable to a wide variety of architectures and/or circuit arrangements.

Figure 3:
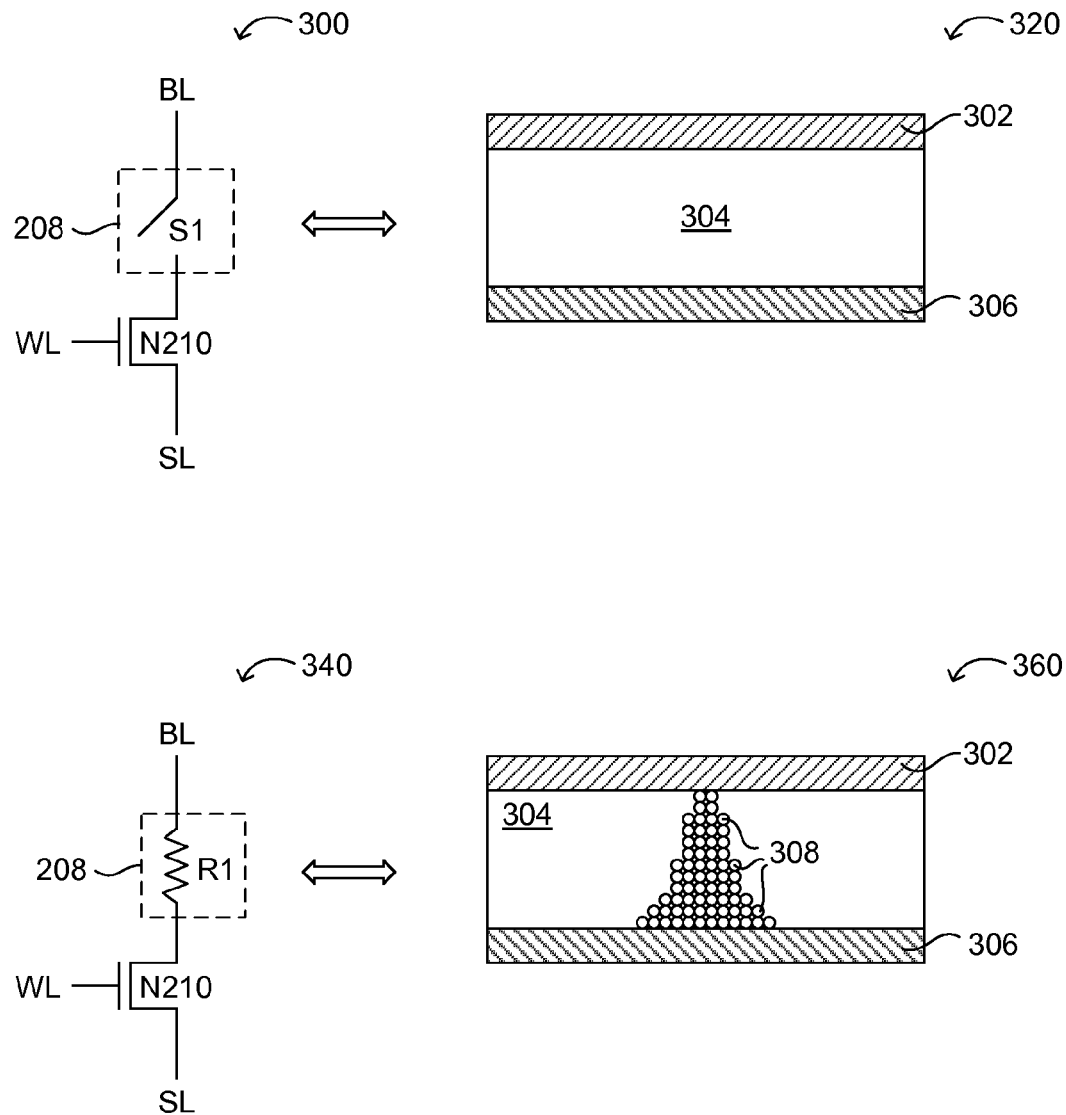
FIG. 3 is a diagram of an example programmable impedance element with schematic modeling.

Referring now to FIG. 3, shown is a diagram of an example programmable impedance element with schematic modeling. For example, example 300 shows a memory cell with an open switch S1 representation of PMC 208. The PMC portion of this representation corresponds to the cross-section diagram 320, which represents a PMC or programmable impedance element in a high impedance state (e.g., state "0"), or an erased state. As used herein, "PMC" may be one example of a "programmable impedance element." Programmable impedance elements can also include any type of resistive switching or resistance-change memory cells. In one example, PMC 320 can include electrochemically active electrode 302, solid electrolyte 304, and inert electrode 306. The example PMC 320 may represent a strong or substantially erased state of the cell. As shown, substantially no conductive path between active electrode 302 and inert electrode 306 is seen in PMC 320.

Schematic representation 340 and corresponding cross-section diagram 360 show examples of PMC 208 in a low impedance state (e.g., state "1"), or a programmed state. For example, example 340 shows a memory cell with a resistor R1 or closed switch representation of PMC 208. The PMC portion of this representation corresponds to the cross-section diagram 360. In the example 360, electrodeposits 308 can form in solid electrolyte 304 to form a "bridge" or conductive path between electrochemically active electrode 302 and inert electrode 306. For example, electrodeposits 308 can be from active electrode 302, and may include silver. As shown in example PMC 360, a full conductive path may be formed between active electrode 302 and inert electrode 306 by electrodeposits 308.

As shown in examples 300 and 340, a control transistor (e.g., N210) can also be included in each memory cell including the programmable impedance element or PMC 208. For example, transistor N210 can be controlled by a word line 204, as discussed above with respect to FIG. 2. Transistor N210 may be an access transistor to allow PMC 208 to be programmed and erased (e.g., including a strong erase followed by a soft program operation).

PMC is based on a physical re-location of ions within a solid electrolyte (e.g., 304). A PMC memory cell or programmable impedance element may be formed of two solid metal electrodes 302 and 306, one relatively inert (e.g., 306) and the other electrochemically active (e.g., 302), with a relatively thin film of the electrolyte (e.g., 304) between the electrodes. As shown in the cross-section diagrams herein, however, the solid electrolyte layer is shown as thicker than the electrodes for illustration purposes.

Various materials can be utilized to form electrodes 302 and 306. For example, inert electrode 306 can include tungsten, and electrochemically active electrode 302 can include silver, copper, or their metal compound. In operation, when a negative bias is applied to inert electrode 306, metal ions in solid electrolyte 304, as well as some originating from the now-positive active electrode 302, can flow in solid electrolyte 304, and are reduced or converted to atoms by electrons from inert electrode 306. After a relatively short period of time, the ions flowing into the filament form a small metallic effective "nanowire" or conductive path between the two electrodes. Such a nanowire can lower the resistance along the conductive path between electrodes 302 and 306, as represented by the open switch model in schematic 300 and the resistor model in schematic 340. Also, the lowered resistance across electrodes 302 and 306 can be measured to indicate that the writing or programming process is complete.

Such a nanowire may not be a continuous wire, but rather a chain of electrodeposit islands or nanocrystals (electrodeposits) 308. A conductive path between the electrodes may appear as more of the chain of electrodeposits under certain operating conditions, particularly at relatively low programming currents (e.g., less than about 1 μA). However, higher programming currents can lead to a mostly metallic conductor or conduction path. Also, and as discussed above, reading the cell data can include switching on the control transistor (e.g., N210), and applying a relatively small voltage across the cell. If a nanowire is in place in that cell (e.g., 360), the resistance can be relatively low, leading to higher current, and that can be read as a "1" data value stored in that cell. However, if there is no nanowire or conductive path between electrodes in the cell (e.g., 320), the resistance is higher, leading to low current, and that can be read as a "0" data value stored in that cell.

Cell data can be erased in similar fashion to cell programming, but with a positive bias on the inert electrode. The metal ions will then migrate away from the filament, back into the electrolyte, and eventually to the negatively-charged active electrode (e.g., 302). This action dissolves the electrodeposits 308 in solid electrolyte 304, and increases the resistance again (e.g., as shown in schematic representation 300). In this way, an erase operation of a PMC may be substantially symmetric to a program operation.

In conductive bridging random-access memory (CBRAM) applications, metal ions can dissolve readily in the material (e.g., 304) between the two electrodes (e.g., 302 and 306). However, in resistive RAM (ReRAM) applications, the material between the electrodes may require a high electric field that can cause local damage and may produce a trail of conducting defects (a "filament"). Thus, for CBRAM, one electrode provides the dissolving ions, while for ReRAM, a one-time "forming" step may be required to generate the local damage. Particular embodiments, however, are suitable for any type of resistive switching or resistance-change memory cell or device.

Example Triggered Cell Annihilation for Resistive Switching Memory

Data security is increasingly important as memory devices become more portable, and the memory storage capacities of such devices continue to increase. For example, a single universal serial bus (USB) memory stick, a smart phone, or a laptop, etc., can easily store gigabytes of information. In some applications, it may be desirable for such devices to have a predetermined limited lifetime (e.g., printer cartridges), and to be permanently disabled at the end of that predetermined lifetime. In particular embodiments, resistive switching memory cells can be permanently disabled, rendered inoperable, or otherwise effectively "annihilated" based on predetermined criteria (e.g., data security related information) and/or real-time information about the resistive switching memory device.

Figure 4:
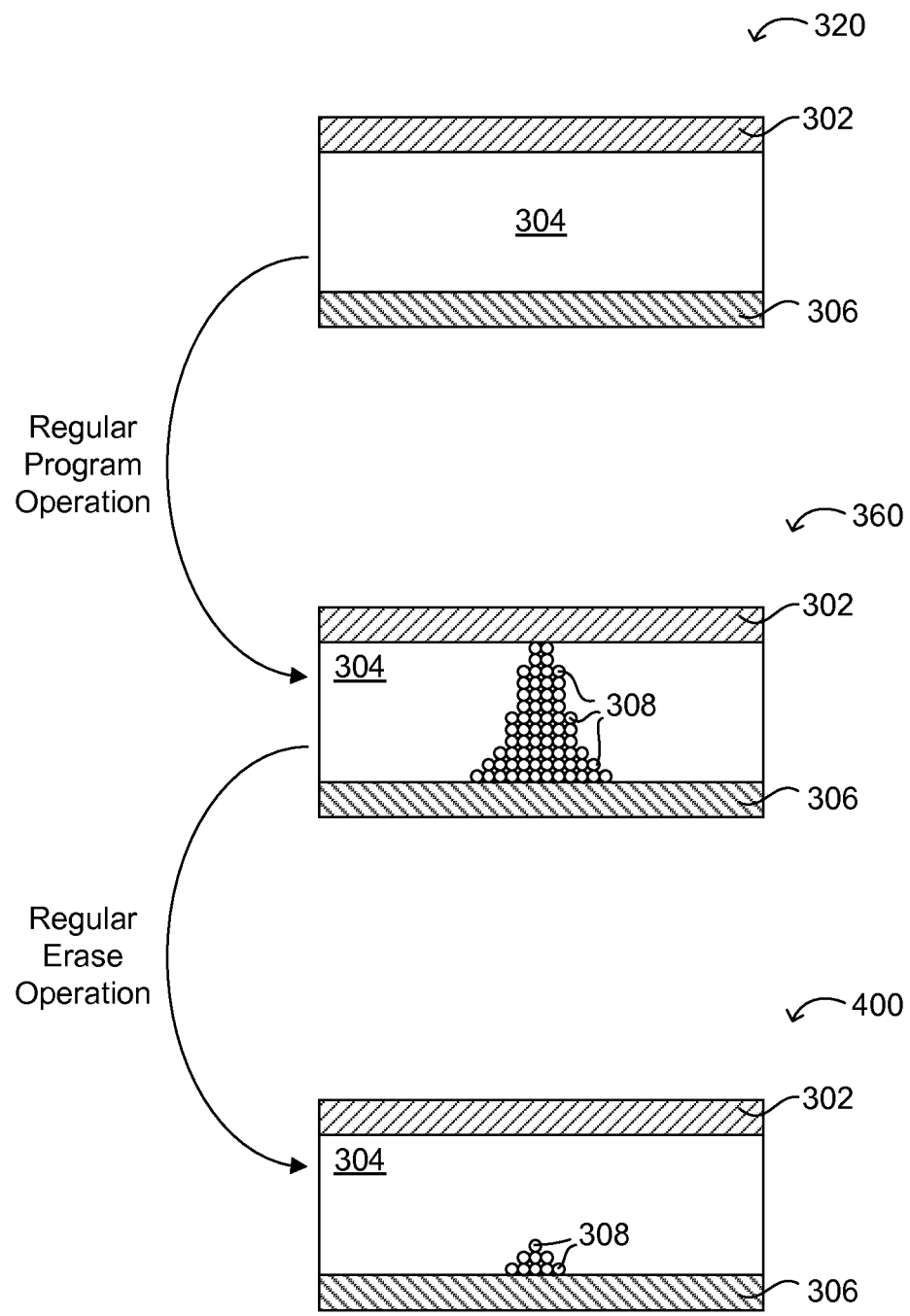
FIG. 4 is a diagram showing example regular program and erase operations on a programmable impedance element.

Referring now to FIG. 4, shown is a diagram of example regular program and erase operations on a programmable impedance element. As noted above, particular embodiments are suitable for any type of resistance-change or resistive switching memory device. In this example, a resistive switching memory cell (e.g., a programmable impedance element or PMC) can include electrochemically active electrode 302 and inert electrode 306 on either side of solid electrolyte 304. As discussed above, this cell works by a filamentary/conduction bridge mechanism, and as such a regular program operation can include formation of a conductive bridge of electrodeposits 308 as shown in 360. A regular erase operation can substantially dissolve electrodeposits 308 such that a conductive bridge is not completed between electrodes 302 and 306, as shown in example 400. Depending on the voltages, currents, and/or pulse widths involved in the erase operation, different bridge or filament portions may remain in solid electrolyte 304, or these may be fully removed, such as shown in example 320. Also in particular embodiments, voltages, currents, and/or pulse widths involved in either program or erase operations can be adjusted in order to render the memory cell inoperable as to subsequent operations.

This particular resistive switching memory may function as shown in Equation (1) below, where $V_{cell}$=cell voltage, $V_{EAE}$=voltage at the electrochemically active electrode, and $V_{IE}$=voltage at the inert electrode.

$$V_{cell}=V_{EAE}-V_{IE} \quad (1)$$

A positive $V_{cell}$ may be applied to the cell for a program operation, and a negative $V_{cell}$ may be applied for an erase operation. A conductive filament/path can be formed during program (see, e.g., 360), and the memory cell thus may enter into a low resistance state (data state 1). During an erase operation, this filament or conductive bridge may be broken, and the memory cell can enter into a high resistance state (data state 0), as shown in example 400. Of course, other electrodeposit patterns, numbers of electrodeposits 308, filament patterns, etc., may also exist for program and erase operations of a resistive switching memory cell.

The resistance state that may be reached during the programming operation may be dependent on the program current and the applied voltage, and can be represented as shown below in Equation (2), where $I_{CC}$ represents a compliance current or a current through the cell in order to read out a resistance value.

$$R_{programmed}=V_{cell}/I_{cc} \quad (2)$$

Particular embodiments can include various types of resistive switching memory devices and cells therein, where such cells can be rendered inoperable based on various triggers. In one embodiment, a programmable impedance element can include: (i) an electrochemically active electrode; (ii) a solid electrolyte coupled to the active electrode; (iii) an inert electrode coupled to the solid electrolyte on an opposite side than the active electrode; (iv) where the programmable impedance element is configured to be programmed by formation of a conductive path between the active and inert electrodes by application of a first voltage across the active and inert electrodes; (v) where the programmable impedance element is configured to be erased by dissolving the conductive path by application of a second voltage across the active and inert electrodes; and (vi) where the programmable impedance element is configured to be rendered inoperable by application of a third voltage across the active and inert electrodes, the third voltage being greater in absolute value than either of the first and second voltages.

Figure 5:
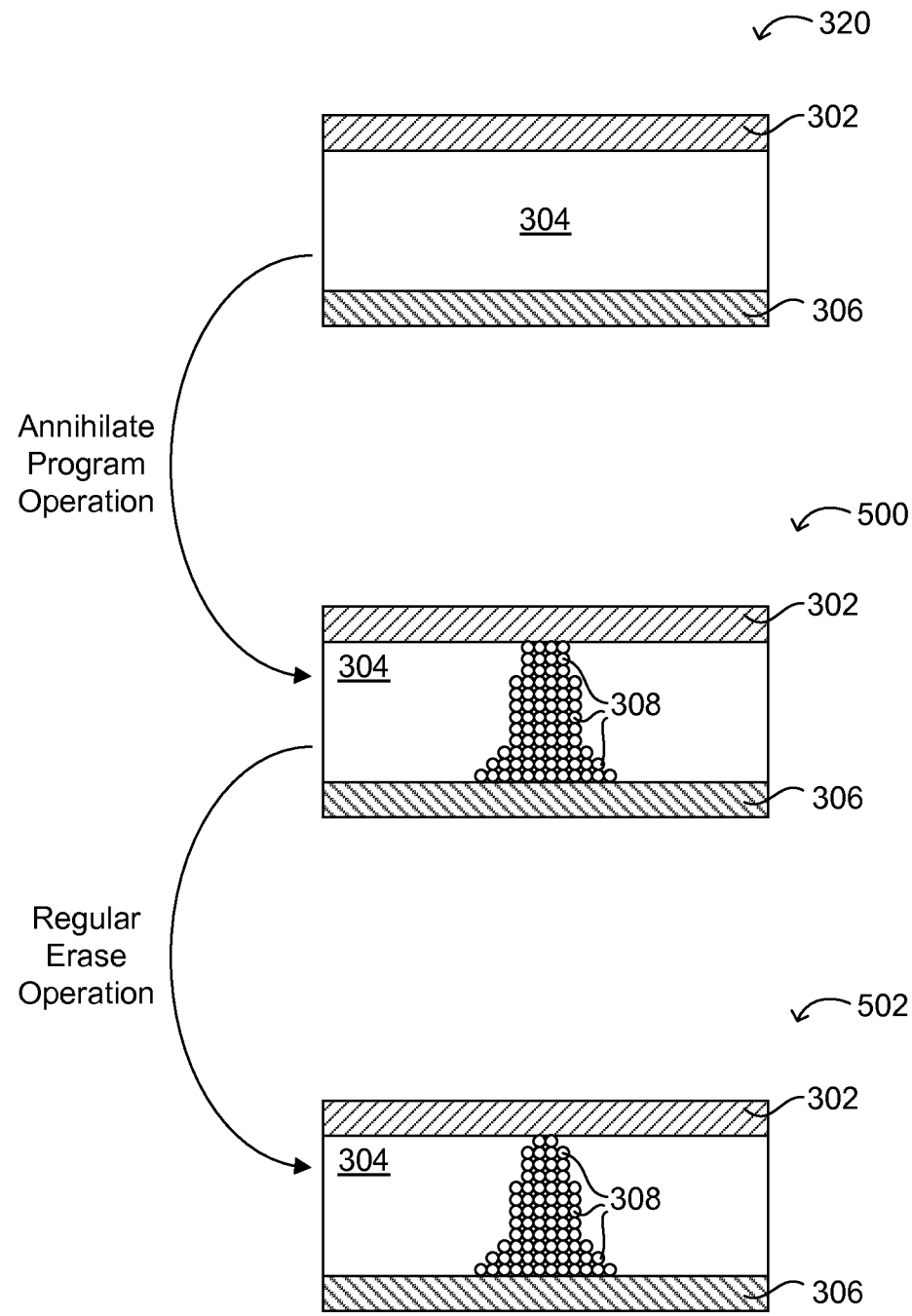
FIG. 5 is a diagram showing an example cell annihilation program operation on a programmable impedance element in accordance with embodiments of the present invention.

Referring now to FIG. 5, shown is a diagram of an example cell annihilation program operation on a programmable impedance element, in accordance with embodiments of the present invention. In some cases, which may include one or more of high voltages, high currents, and longer pulse widths, such memory cells can be placed into a 'hard' breakdown regime whereby such cells may no longer be erasable or programmable. Thus, a programmed data 1 state may remain despite subsequent erase attempts, and an erased data 0 state may remain despite subsequent program attempts. These conditions can be seen as a 'failure' in a regular memory operation scheme. However, such hard breakdown regimes can allow for targeted and triggered resistive switching memory cell annihilation in particular embodiments.

Accordingly, such failure conditions may be a feature of the device in particular embodiments in the form of a programmed, erased, and/or triggered memory cell annihilation mode. As discussed above, voltages, currents, pulse widths, or other operation parameters, that are used in program and erase operations can be adjusted in order to accommodate a cell annihilation mode. In one particular voltage adjustment example, operating modes and their respective operating voltages are given below in Table 1.

TABLE 1

$V_{cell}$ values for the example operation

|  | Program | Erase | Read | Annihilate |
|---|---|---|---|---|
| Vcell (V) | 1.2 | −0.5 | 0.3 | 3 |

Thus in this example, a substantially higher voltage (e.g., 3V) can be utilized during the program operation (as compared to a regular program voltage, e.g., 1.2V) in order to reach such a hard or irreversible breakdown regime. In the example shown in FIG. 5, an annihilate program operation (e.g., with such an annihilate voltage) can be used to essentially over-program the memory cell, as shown in example 500. Subsequently, a regular erase operation can result in a memory cell state as shown in example 502. Depending on the particular voltages, currents, pulse widths, etc., some electrodeposits 308 may be removed from the conductive bridge shown in example 500. However, in some cases there may be no substantial difference between the memory cell state or conductive bridge/filament pattern resulting from an annihilate program operation and any subsequent erase operations. In any event, the subsequent regular erase operation may not be successful because the cell has effectively been rendered inoperable due to the annihilate program operation. As such, this particular memory cell can remain in a low resistance (state 0) data state.

Figure 6:
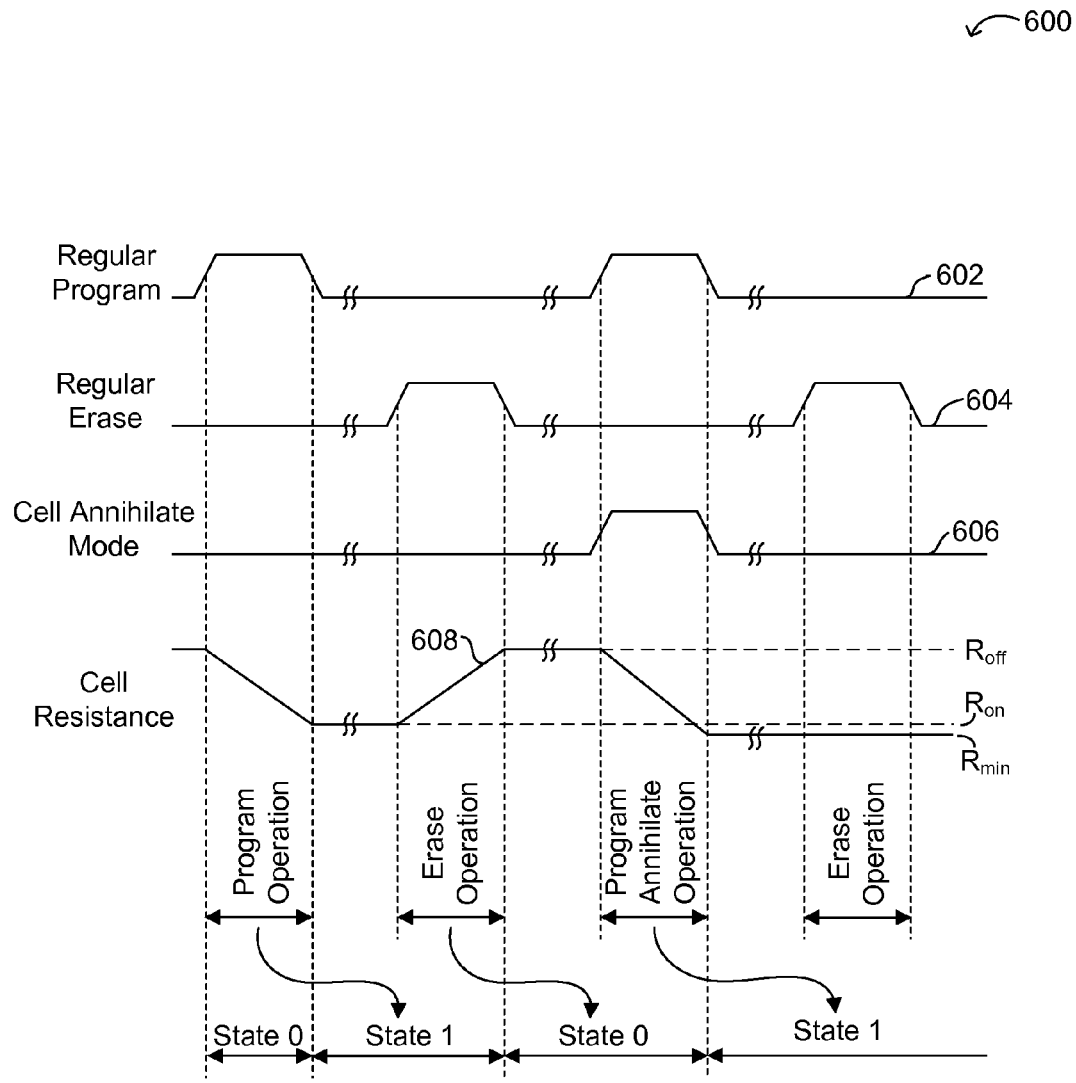
FIG. 6 is a waveform diagram of an example cell annihilation program operation in accordance with embodiments of the present invention.

Referring now to FIG. 6, shown is a waveform diagram 600 of an example cell annihilation program operation in accordance with embodiments of the present invention. In this example, a regular program pulse can be as shown in waveform 602. Thus, a regular program operation can result in a low resistance (state 1) data state. A regular erase pulse as shown in waveform 604 can result in an erase operation that changes the memory cell resistance to a high resistance (state 0) data state. Thus, the cell operation may be considered normal operation to this point because the cell can be programmed and erased to change the data state.

If a cell annihilation is triggered, the data state that is entered into as a result may not be able to subsequently be changed. As shown in waveform 606, a cell annihilation mode coupled with a program pulse (waveform 602) may result in a program annihilation operation that brings the memory cell back to a low resistance data state. The resistance of the memory cell may change as shown in waveform 608. In some cases, this low resistance data state after a program annihilation mode can result in a minimum resistance $R_{min}$ that may be less than or equal to $R_{on}$. In other cases, the low resistance state after a program annihilation mode can be substantially the same as $R_{on}$. In any case, following a program annihilation mode operation, subsequent erase operations may have no substantial effect on the cell resistance, and in particular the memory cell may remain in a low resistance (state 1) data state.

While various pulse widths and mode control signaling are described herein, other types of controls, pulse widths, etc., can also be accommodated in particular embodiments. For example, the cell annihilate mode signal represented by waveform 606 may be combined with the regular program pulse signal as represented by waveform 602. As another example, the cell annihilate mode signal may be a control signal that is used to adjust various program operation parameters, such as voltages, currents, pulse widths, etc., and the signal may not necessarily be coincident with an actual regular program pulse as represented by waveform 602. In any event, the example cell annihilate mode signal represented by waveform 606 may indicate the triggering of a cell annihilation mode in order to render a particular resistive switching memory cell inoperable.

In another example, the device can be annihilated by hard erasing and/or reverse-programming the device with a high negative $V_{cell}$ voltage. As discussed above, other erase operation parameters (e.g., currents, pulse widths, etc.) can alternatively, or in addition to the erase voltage, be adjusted in order to render a particular memory cell inoperable. In this particular example, an erase voltage can be adjusted, as shown below in Table 2.

TABLE 2

$V_{cell}$ values for another example operation

|  | Program | Erase | Read | Annihilate |
|---|---|---|---|---|
| Vcell (V) | 1.2 | −0.5 | 0.3 | −3 |

Figure 7:
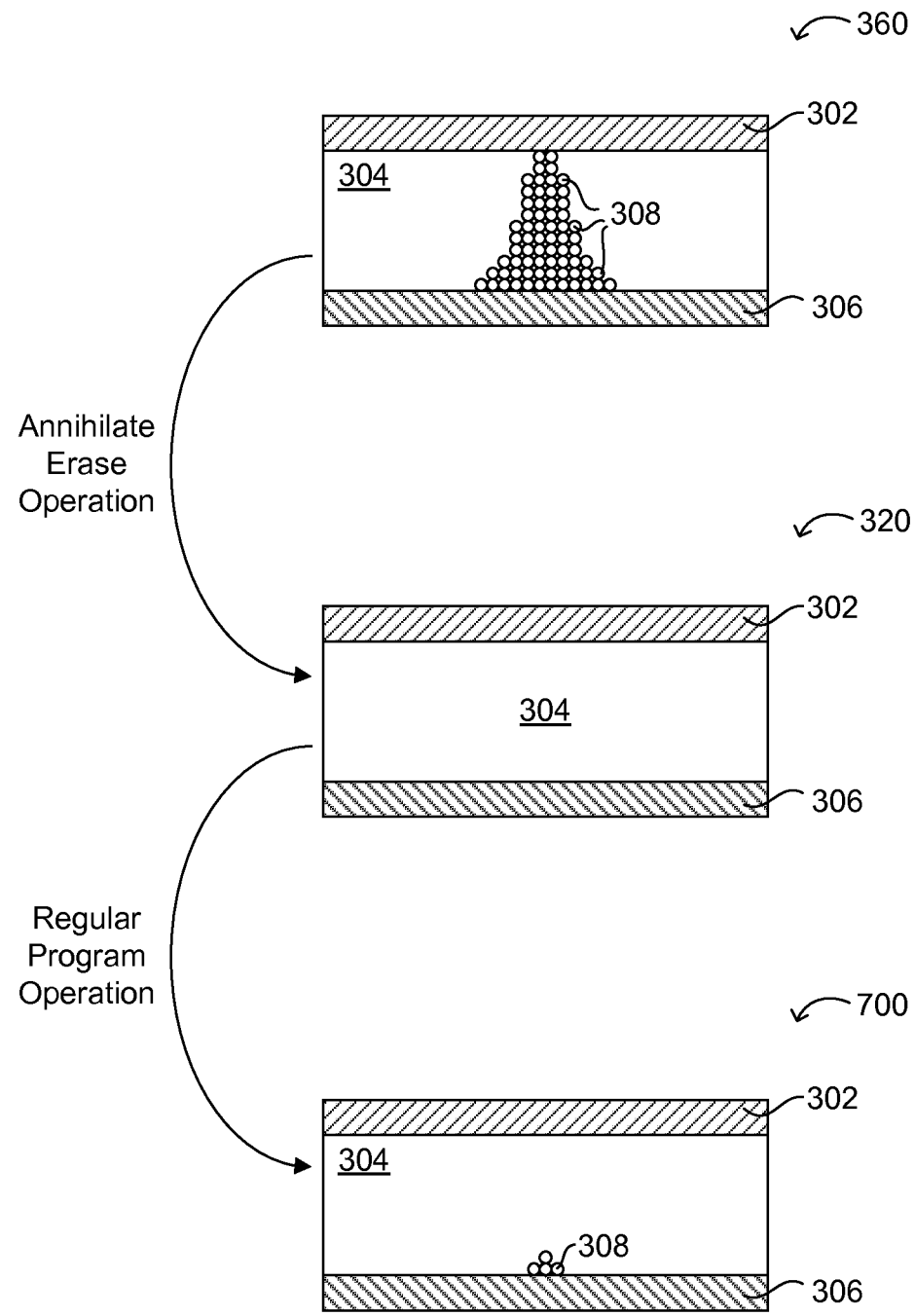
FIG. 7 is a diagram showing an example cell annihilation erase operation on a programmable impedance element in accordance with embodiments of the present invention.

Thus in this example, a substantially higher voltage in absolute value (e.g., −3V) can be utilized during the erase operation (as compared to a regular erase voltage, e.g., −0.5V) in order to reach such a hard or irreversible breakdown regime. Referring now to FIG. 7, shown is a diagram of an example cell annihilation erase operation on a programmable impedance element in accordance with embodiments of the present invention. In this example, an annihilate erase operation (e.g., with such an annihilate voltage) can be used to essentially over-erase the memory cell, as shown in example 320. Subsequently, a regular program operation can result in a memory cell state as shown in example 700. Depending on the particular voltages, currents, pulse widths, etc., some electrodeposits 308 may be formed in solid electrolyte 304 as shown in example 500. In other cases, substantially no electrodeposits 308 or other filamentary materials may form as a result of this subsequent regular program operation. However, in any event, the regular program operation may not be successful because the cell has effectively been rendered inoperable due to the annihilate erase operation. As such, this particular memory cell can remain in a high resistance (state 1) data state, and may be substantially unaffected by subsequent program attempts.

Figure 8:
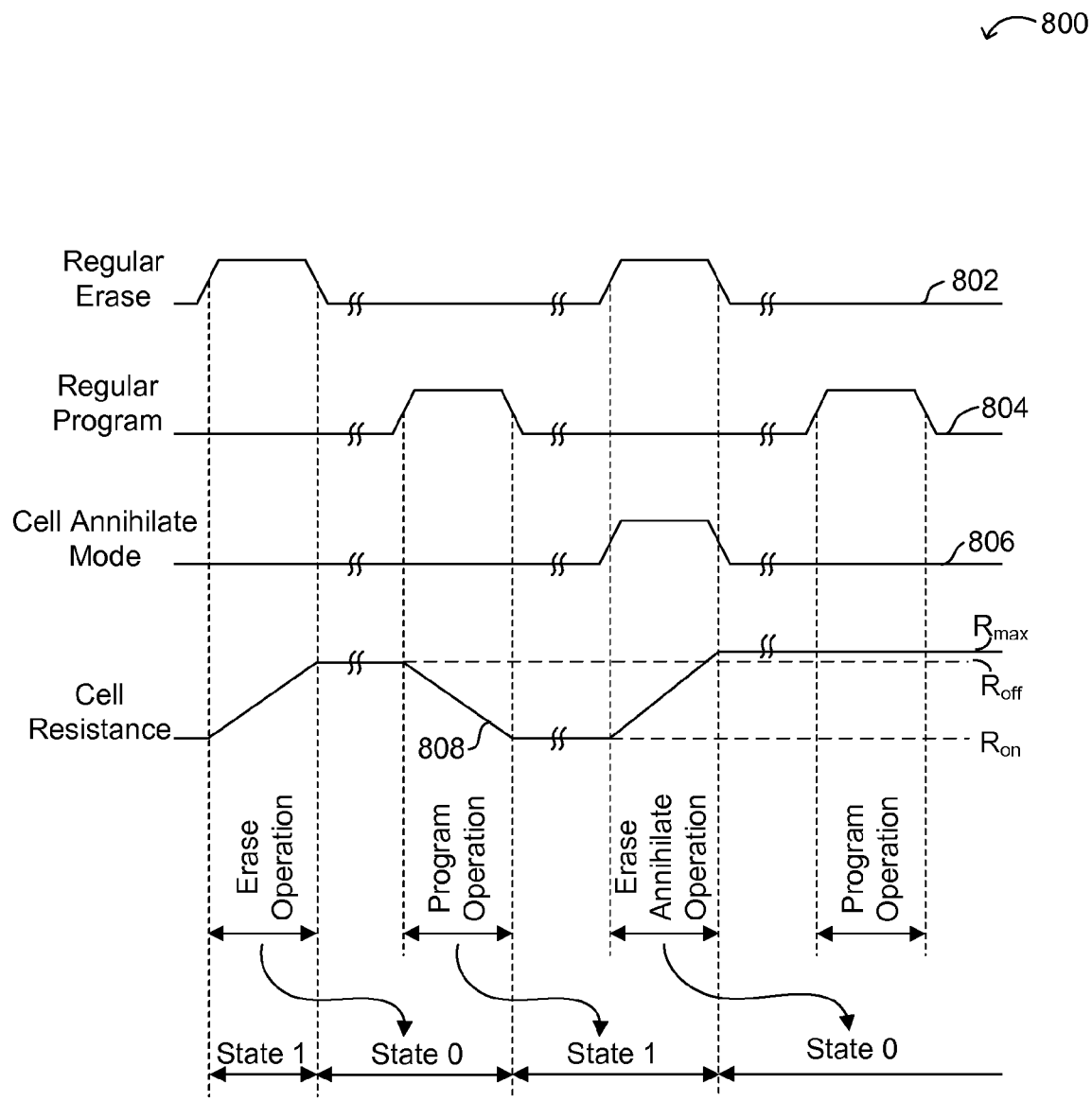
FIG. 8 is a waveform diagram of an example cell annihilation erase operation in accordance with embodiments of the present invention.

Referring now to FIG. 8, shown is a waveform diagram 800 of an example cell annihilation erase operation in accordance with embodiments of the present invention. In this example, a regular erase pulse can be as shown in waveform 802. Thus, a regular erase operation can result in a high resistance (state 0) data state. A regular program pulse as shown in waveform 804 can result in a program operation that changes the memory cell resistance from a high to a low resistance (state 1) data state. As shown in waveform 806, a cell annihilation mode coupled with an erase pulse (waveform 802) may result in an erase annihilation operation that brings the memory cell back to a high resistance data state. The resistance of the memory cell may change as shown in waveform 808. In some cases, this high resistance data state after an erase annihilation mode can result in a maximum resistance $R_{max}$ that may be greater than or equal to $R_{off}$. In other cases, the high resistance value after an erase annihilation mode can be substantially the same as $R_{off}$. In any event, subsequent program operations may have no substantial effect on the cell resistance, and in particular the memory cell may remain in a high resistance (state 0) data state. Thus, the memory cell may be effectively rendered inoperable.

While various pulse widths and mode control signaling are described herein with respect to erase operation cell annihilation, other types of controls, pulse widths, etc., can also be accommodated in particular embodiments. For example, the cell annihilate mode signal represented by waveform 806 may be combined with the regular erase pulse signal as represented by waveform 802. As another example, the cell annihilate mode signal may be a control signal that is used to adjust various erase operation parameters, such as voltages, currents, pulse widths, etc., and the signal may not necessarily be coincident with an actual regular erase pulse as represented by waveform 802. In any event, the example cell annihilate mode signal represented by waveform 806 may indicate the triggering of a cell annihilation mode in order to render a particular resistive switching memory cell inoperable.

In this way, a triggered cell annihilation mode can operate in conjunction with other program or erase operation controls. Further, the cell annihilation mode can be activated by, e.g., applying high program/erase voltages, which can place the cells in an irreversible low/high resistance state. As discussed above, other programs/erase operation parameters (e.g., pulse widths, currents, etc.) can alternatively or additionally be adjusted along with program/erase voltages, in order to bring about such permanent disabling of a resistive switching memory cell.

In various embodiments, a product or device that may be subjected to possible memory cell annihilation as described herein, can include various components and controls. In one embodiment, a resistive switching memory device can include: (i) a plurality of resistive memory cells, where each of the resistive switching memory cells is configured to be programmed to a low resistance state by application of a first voltage, and to be erased to a high resistance state by application of a second voltage; (ii) a detector configured to detect when at least one of the plurality of resistive switching memory cells is to be rendered inoperable; (iii) a program controller configured to render the at least one resistive switching memory cell inoperable by application of a third voltage during a program operation, where the third voltage is greater in absolute value than the first voltage, and where the at least one resistive switching memory cell rendered inoperable remains in the low resistance state after subsequent erase operations; and (iv) an erase controller configured to render the at least one resistive switching memory cell inoperable by application of a fourth voltage during an erase operation, where the fourth voltage is greater in absolute value than the second voltage, and where the at least one resistive switching memory cell rendered inoperable remains in the high resistance state after subsequent program operations.

Figure 9:
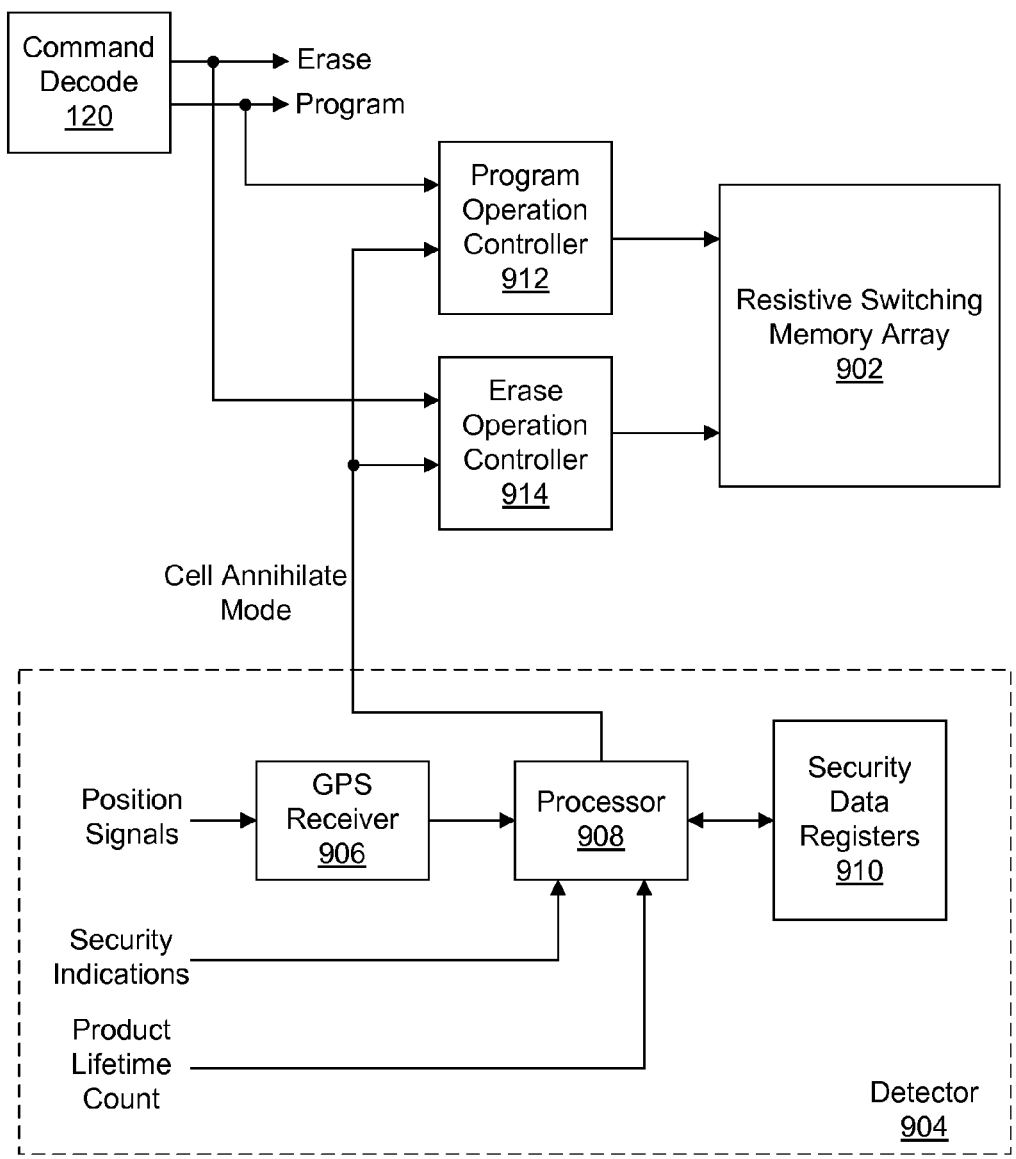
FIG. 9 is a block diagram of example cell annihilation mode control in accordance with embodiments of the present invention.

Referring now to FIG. 9, shown is a block diagram 900 of example cell annihilation mode control in accordance with embodiments of the present invention. Resistive switching memory array 902 can be any suitable arrangement of resistive switching memory cells, such as the particular example shown above in FIG. 2. In this example, standard command control (e.g., via command decode 120) can be used to generate erase and program control signals in response to commands supplied to the device. For example, a program control signal can be provided to program operation controller 912, and an erase control signal can be provided to erase operation controller 914. As shown, program and erase operation controllers 912 and 914 can be used to control corresponding operations in resistive switching memory array 902.

As discussed above, particular embodiments can allow for rendering a memory cell inoperable or otherwise effectively annihilating that memory cell for effective data storage and recovery operations. Further, resistive switching memory array 902 may represent a designated portion of a larger such memory array that can be subjected to triggered cell annihilation. Thus in some cases, only portions of a resistive switching memory device may be made available for possible triggered cell annihilation, while other portions may be excluded from such operations. For example, those memory array portions designated for high-security data storage may be subjected to possible triggered cell annihilation, while excluded memory array portions may be allocated for storage of lower security data. Particular embodiments support the designation of various memory array portions in this manner, and such designation can include address bit control, fuse or other hardware types of control, software or firmware-based control depending on the end product, or any other suitable type of array segmentation or control. Thus, memory cell annihilation can be performed on an array block, sub-block, or individual memory cell basis.

Various real-time and stored security data information can be used in order to trigger the cell annihilation mode. In one example, detector 904 can be used to generate a cell annihilate mode signal that can be supplied to program and erase operation controllers 912 and 914. As discussed above, a cell annihilate mode signal can be used as a control trigger, and in particular can be used in conjunction with a program or erase operation. In this way, regular program and erase operations can have parameters enhanced or adjusted (e.g., by greater voltages, longer pulse widths, increased currents, etc.) in order to effectively render a designated memory cell as inoperable as to any subsequent operations.

Various applications and/or predetermined criteria can be used in order to determine whether one or more of the resistive switching memory cells in array 902 are to be rendered inoperable or annihilated. For example, a product lifetime count can be fed into processor 908, for possible comparison against related data (e.g., a maximum lifetime count) found in security data registers 910. Processor 908 can include any general-purpose processing unit (e.g., a central processing unit [CPU]) or microcontroller, and security data registers 910 can include any suitable type of memory, such as non-volatile memory. Also, other security indications (e.g., secure device applications, anti-theft applications, data protection applications, etc.) can also be provided to processor 908, and may also be compared against security data in registers 910.

For example, a cell annihilation mode can be triggered in planned lifetime products (e.g., printer cartridges), cryptography applications, and/or anti-theft data protection services. In one example, planned lifetime products can include printer cartridges where the manufacturers may not want users to refill their old cartridges. Thus, after some predetermined number of cycles, a cell annihilation mode can be triggered and all or a portion of resistive switching memory array 902 on the cartridge can be annihilated in order to make the associated cartridge no longer usable. In this case, the maximum time or lifetime count information can be stored in security data registers 910.

In an anti-theft/data protection application example, if a device (e.g., cell phone, laptop, tablet, notebook device, etc.) using a resistive switching memory is stolen, a cell annihilation mode can be triggered. In one case, information indicating that the device has been stolen can be pushed wirelessly to the device to trigger the cell annihilation mode. In another example, a cell annihilation mode can be triggered if a password is incorrectly entered some specific number of times (e.g., as stored in registers 910), possibly indicating theft or misuse. Thus in particular embodiments, various security-related measures can be considered, and designated stored data in resistive switching memory array 902 can be intentionally destroyed by way of the cell annihilation mode based on the results of the security-based consideration.

In addition, devices may make use of a global positioning system (GPS) chip (e.g., GPS receiver 906) to receive position related signals, and to determine a current location of a device including resistive switching memory array 902. For example, specific allowable regions and/or allowable routes can be set (e.g., a specific radius of a headquarters of a company) and stored as coordinates in security data registers 910. Thus, a device located outside of such a predefined range, which may indicate theft or other misuse, may be detected via GPS receiver 906, and subsequently used to activate the cell annihilate mode. In this way, certain data can be destroyed instead of being accessed by an unauthorized user, or used in an unauthorized geographic location.

As another example, for a specific employee, the employee's office space, the employee's house, and the employee's possible commute routes, etc., can be used to define an allowable location range for that employee. If the device is taken outside of such allowable regions and/or allowable routes, or otherwise displays an unusual deviation from such allowable locations, the cell annihilation mode can be activated automatically to completely destroy the designated data within. In this way, data security and/or confidentiality can be maintained based on predefined limits, such as geographic location limits, or other use authorization limits.

In many data storage systems, even when the user apparently deletes the data, the actual physical data stored in the memory may not be physically erased. Thus, with the help of an agent, software, and/or a device designed for data recovery, one can recover the information that was stored after the fact, even though that information was thought to be deleted. In cases where the data security and/or confidentiality is crucial, such an approach allowing data recovery is not acceptable, and thus annihilating the cells as in particular embodiments can supply superior security based protection.

In addition, because many resistive switching memory technologies exhibit a memristance or history effect, even after a physical erase operation, it may be preferable to annihilate such devices headed for disposal. In this way, the memristance/history effect may not be taken advantage of in order to retrieve data or some portions of the data and/or some properties of the data thought to be erased, which may result in security vulnerability. Instead, particular embodiments may be used to render a resistive switching device inoperable when the cell annihilation mode is invoked.

Various types of cell annihilation control and operation can be supported in particular embodiments. In one embodiment, a method of rendering a resistive switching memory device inoperable can include: (i) accessing security data related to the resistive switching memory device; (ii) determining whether the security data indicates that the resistive switching memory device is to remain operable; (iii) performing at least one of programming, erasing, and reading the resistive switching memory device when the security data is determined to indicate that the resistive switching memory device is to remain operable, where the programming includes changing a resistance of a resistive switching memory cell to a low resistance state by applying a first voltage, and where the erasing comprises changing the resistance of the resistive switching memory cell to a high resistance state by applying a second voltage; and (iv) disabling the resistive switching memory device when the security data is determined to indicate that the resistive switching memory device is to be rendered inoperable by applying a third voltage, where the third voltage is greater in absolute value than either of the first and second voltages.

Figure 10:
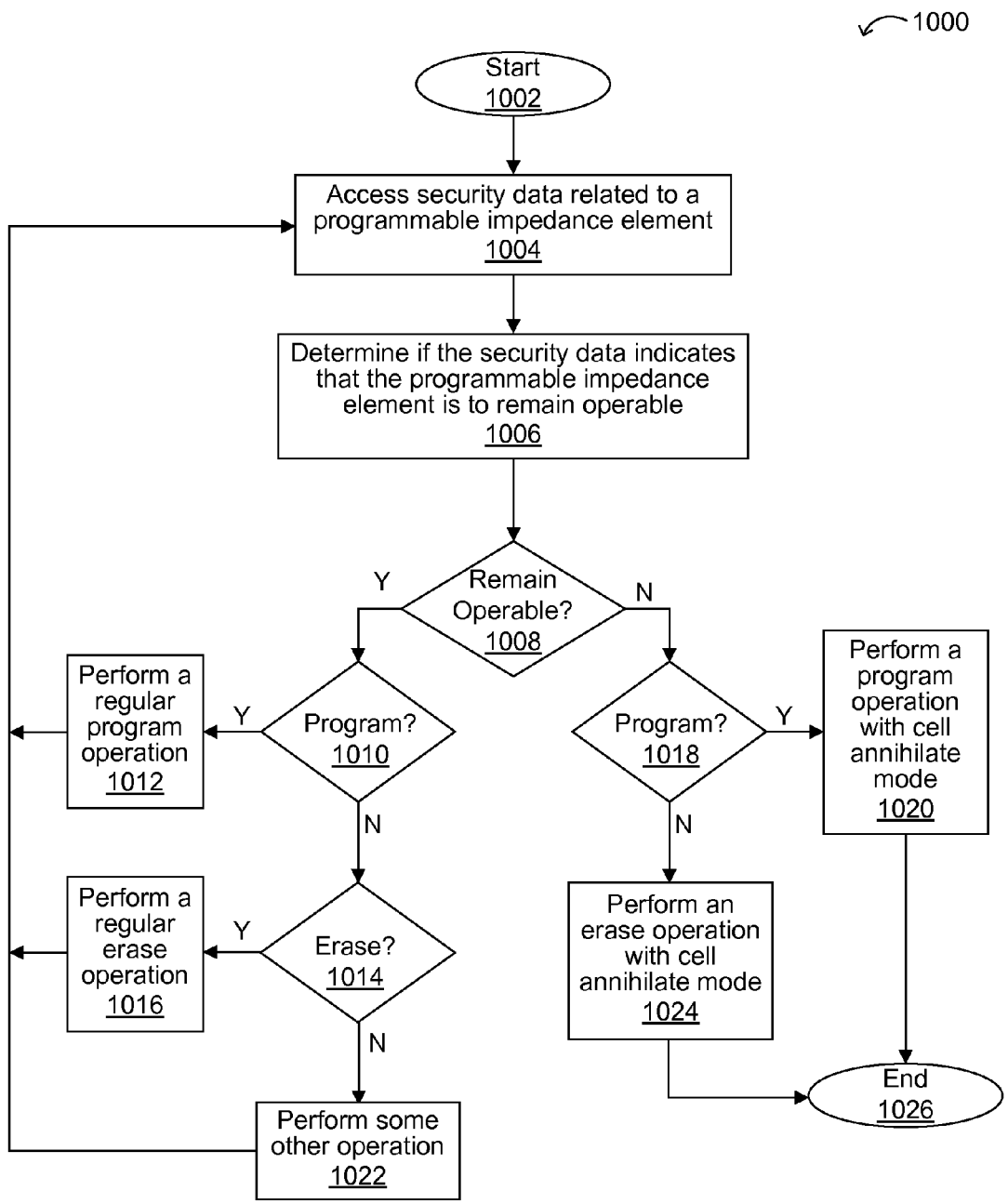
FIG. 10 is a flow diagram of example cell annihilation and regular operation control in accordance with embodiments of the present invention.

Referring now to FIG. 10, shown is a flow diagram 1000 of example cell annihilation and regular operation control in accordance with embodiments of the present invention. The flow can begin at 1002, and security data related to a programmable impedance element can be accessed at 1004. For example, such data can be accessed from security data registers 910. At 1006, a determination can be made as to whether the security data indicates that the programmable impedance element is to remain operable, or is to be rendered inoperable. For example, other security related and possibly real-time information (e.g., location information, security indications, product lifetime count, etc.) can be compared against security data (e.g., geographic limitation data, maximum lifetime count, etc.) from registers 910 in order to determine whether the resistive switching memory device is to remain operable or be fully or partially disabled.

If the resistive switching memory is to remain operable at 1008, a suitable regular operation can occur. For example, if the operation is a program operation at 1010, a regular program operation can be performed at 1012. Similarly, if the operation is an erase operation at 1014, a regular erase operation can be performed at 1016. Of course, any suitable other operation (e.g., a read operation, a verify operation, etc.) can be performed at 1022. Thus, the device can remain in normal or regular operation absent any triggering of the cell annihilation mode.

However, if one or more memory cells of the resistive switching memory are to be rendered inoperable or annihilated at 1008, one or more regular operations may be enhanced in such fashion so as to enter a hard breakdown regime, thus rendering a corresponding memory cell inoperable as to subsequent operations. For example, a program operation at 1018 can be used in a program operation with cell annihilate mode at 1020, completing the flow at 1026. Alternatively, an erase operation with cell annihilate mode can be used at 1024, thus completing the flow 1026. In either such case of program or erase operations, one or more of voltages, pulse widths, currents, or other operation parameters, can be increased or otherwise adjusted in order to effectively annihilate the corresponding cell via that operation.

In this way, particular embodiments can provide for data security by allowing for the intentional disabling of memory cells. As discussed above, one or more operational parameters (e.g., voltages, currents, pulse widths, etc.) can be adjusted such that a given program or erase operation may result in effective annihilation of one or more memory cells. Of course, such a program or erase operation may actually be a series of such operations, and can include variations or adjustments of the operational parameters (e.g., increased voltages, longer pulse widths, etc.) until the desired cell annihilation state is achieved. Further, it should be noted that other types of predetermined criteria, such as security-related information, can be employed in order to determine triggering of a cell annihilation mode as described herein.

It is also noted that, while only two storage states (state "0" and state "1") have been significantly described herein, PMCs or other resistive switching memory cells may also each support more than one memory state. For example, depending on the voltage level controls, instead of a full erase or a full program/write, partial operations (e.g., by applying less/predetermined voltages for forward bias and reverse bias of the PMC, by applying different program current, etc.) can be performed. Such partial operations can produce different resistance values in the cell, as opposed to the cell having an on/off resistance corresponding to two storage states. Instead, a binary coding of, e.g., eight different bands or ranges of PMC on resistances can be converted into 3-bit storage values. Thus in this example, eight different data values can be stored in a given PMC. Of course, other numbers of data values can be stored based on the resistance, bias voltage, and/or current characteristics.

While the above examples include circuit, operational, and structural implementations of certain memory cells and programmable impedance devices, one skilled in the art will recognize that other technologies and/or cell structures can be used in accordance with embodiments. Further, one skilled in the art will recognize that other device circuit arrangements, architectures, elements, and the like, may also be used in accordance with embodiments. Further, the resistance levels, operating conditions, and the like, may be dependent on the retention, endurance, switching speed, and variation requirements of a programmable impedance element.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A resistive switching memory device, comprising:
   a) a plurality of resistive memory cells, wherein each of the resistive switching memory cells is configured to be programmed to a low resistance state by application of a first voltage, and to be erased to a high resistance state by application of a second voltage;
   b) a detector configured to detect when at least one of the plurality of resistive switching memory cells is to be rendered inoperable;
   c) a program controller configured to render the at least one resistive switching memory cell inoperable by application of a third voltage during a program operation, wherein the third voltage is greater in absolute value than the first voltage, and wherein the at least one resistive switching memory cell rendered inoperable remains in the low resistance state after subsequent erase operations; and
   d) an erase controller configured to render the at least one resistive switching memory cell inoperable by application of a fourth voltage during an erase operation, wherein the fourth voltage is greater in absolute value than the second voltage, and wherein the at least one resistive switching memory cell rendered inoperable remains in the high resistance state after subsequent program operations.

2. The resistive switching memory device of claim 1, wherein the detector comprises a location detector configured to determine a present location of the resistive switching memory device.

3. The resistive switching memory device of claim 1, further comprising security data registers configured to store security data for determination of continued operability of the resistive switching memory device.

4. The resistive switching memory device of claim 1, wherein the detector is configured to detect when the at least one resistive switching memory cell is to be rendered inoperable based on a planned lifetime of a product comprising the resistive switching memory device.

5. The resistive switching memory device of claim 1, wherein the detector is configured to detect when the at least one resistive switching memory cell is to be rendered inoperable based on a determination of a data protection application.

6. The resistive switching memory device of claim 1, wherein:
   a) the first voltage is about 1.2V;
   b) the second voltage is about –0.5V;
   c) the third voltage is about 3V; and
   d) the fourth voltage is about –3V.

7. A method of rendering a resistive switching memory device inoperable, the method comprising:
   a) accessing security data related to the resistive switching memory device;
   b) determining whether the security data indicates that the resistive switching memory device is to remain operable;
   c) performing at least one of programming, erasing, and reading the resistive switching memory device when the security data is determined to indicate that the resistive switching memory device is to remain operable, wherein the programming comprises changing a resistance of a resistive switching memory cell to a low resistance state by applying a first voltage, and wherein the erasing comprises changing the resistance of the resistive switching memory cell to a high resistance state by applying a second voltage; and
   d) disabling the resistive switching memory device when the security data is determined to indicate that the resistive switching memory device is to be rendered inoperable by applying a third voltage, wherein the third voltage is greater in absolute value than either of the first and second voltages.

8. The method of claim 7, wherein the resistive switching memory device comprises a plurality of memory cells, wherein each of the memory cells comprises a solid electrolyte having an electrochemically active electrode and an inert electrode coupled thereto.

9. The method of claim 8, wherein:
   a) the programming comprises forming a conductive path between the active and inert electrodes by applying the first voltage across the active and inert electrodes; and
   b) the erasing comprises dissolving the conductive path by applying the second voltage across the active and inert electrodes.

10. The method of claim 7, wherein the determining whether the security data indicates that the resistive switching memory device is to remain operable comprises comparing the security data against an output of a location detector that determines a present location of the resistive switching memory device.

11. The method of claim 7, wherein the disabling the resistive switching memory device comprises applying the third voltage during a program operation.

12. The method of claim 7, wherein the disabling the resistive switching memory device comprises applying the third voltage during an erase operation.

13. The method of claim 7, wherein the disabling the resistive switching memory device comprises performing a program operation with at least one of a voltage, pulse width, and current sufficient to place at least one memory cell of the resistive switching memory device in a breakdown regime.

14. The method of claim 7, wherein the disabling the resistive switching memory device comprises performing an erase operation with at least one of a voltage, pulse width, and current sufficient to place at least one memory cell of the resistive switching memory device in a breakdown regime.

15. The method of claim 7, wherein the determining whether the security data indicates that the resistive switching memory device is to remain operable comprises determining a planned lifetime of a product comprising the resistive switching memory device.

16. The method of claim 7, wherein the determining whether the security data indicates that the resistive switching memory device is to remain operable comprises using a data protection application.

17. A programmable impedance element, comprising:
   a) an electrochemically active electrode;
   b) a solid electrolyte coupled to the active electrode;
   c) an inert electrode coupled to the solid electrolyte on an opposite side than the active electrode;
   d) wherein the programmable impedance element is configured to be programmed by formation of a conductive path between the active and inert electrodes by application of a first voltage across the active and inert electrodes;
   e) wherein the programmable impedance element is configured to be erased by dissolving the conductive path by application of a second voltage across the active and inert electrodes; and
   f) wherein the programmable impedance element is configured to be rendered inoperable by application of a third voltage across the active and inert electrodes, the third voltage being greater in absolute value than either of the first and second voltages.

18. The programmable impedance element of claim 17, wherein the second voltage has an opposite polarity of the first voltage.

19. The programmable impedance element of claim 17, wherein the rendered inoperable comprises no longer being able to form the conductive path to program the programmable impedance device.

20. The programmable impedance element of claim 17, wherein the rendered inoperable comprises no longer being able to dissolve the conductive path to erase the programmable impedance device.

* * * * *